(12) United States Patent
Zolfagharkhani et al.

(10) Patent No.: US 8,933,565 B2
(45) Date of Patent: Jan. 13, 2015

(54) INTEGRATED CIRCUIT WIRING FABRICATION AND RELATED METHODS AND APPARATUS

(71) Applicants: Guiti Zolfagharkhani, Brighton, MA (US); Jan H. Kuypers, Cambridge, MA (US)

(72) Inventors: Guiti Zolfagharkhani, Brighton, MA (US); Jan H. Kuypers, Cambridge, MA (US)

(73) Assignee: Sand 9, Inc., Cambridge, MA (US)

( * ) Notice: Subject to any disclaimer, the term of this patent is extended or adjusted under 35 U.S.C. 154(b) by 0 days.

(21) Appl. No.: 13/854,775

(22) Filed: Apr. 1, 2013

(65) Prior Publication Data

US 2013/0307154 A1 Nov. 21, 2013

Related U.S. Application Data

(60) Provisional application No. 61/618,931, filed on Apr. 2, 2012.

(51) Int. Cl.
| | |
|---|---|
| *H01L 23/48* | (2006.01) |
| *H01L 23/52* | (2006.01) |
| *H01L 29/40* | (2006.01) |
| *H01L 29/45* | (2006.01) |
| *H01L 23/498* | (2006.01) |
| *H01L 23/00* | (2006.01) |

(52) U.S. Cl.
CPC .............. *H01L 29/45* (2013.01); *H01L 29/401* (2013.01); *H01L 23/49838* (2013.01); *H01L 23/49866* (2013.01); *H01L 24/05* (2013.01); *H01L 2224/05569* (2013.01); *H01L 2224/10145* (2013.01); *H01L 24/13* (2013.01); *H01L 24/81* (2013.01); *H01L 2224/02375* (2013.01); *H01L 2224/05124* (2013.01); *H01L 2224/05166* (2013.01); *H01L 2224/05171* (2013.01); *H01L 2224/0518* (2013.01); *H01L 2224/05548* (2013.01); *H01L 2224/05555* (2013.01); *H01L 2224/05644* (2013.01); *H01L 2224/13014* (2013.01); *H01L 2224/131* (2013.01); *H01L 2224/13111* (2013.01); *H01L 2224/13144* (2013.01); *H01L 2224/81805* (2013.01); *H01L 2224/81815* (2013.01); *H01L 2224/05568* (2013.01); *H01L 2224/05023* (2013.01)
USPC ................... 257/751; 257/772; 257/E23.001; 438/612; 438/643

(58) Field of Classification Search
USPC ........... 257/751, 772, E23.001; 438/612, 643
See application file for complete search history.

(56) References Cited

U.S. PATENT DOCUMENTS

| | | | |
|---|---|---|---|
| 7,993,983 B1 * | 8/2011 | Lin ................................ 438/127 |
| 2003/0107137 A1 * | 6/2003 | Stierman et al. ............... 257/763 |
| 2004/0100603 A1 * | 5/2004 | Ozawa ........................... 349/123 |
| 2011/0204511 A1 * | 8/2011 | Beddingfield et al. ........ 257/737 |
| 2012/0038043 A1 * | 2/2012 | Jin ................................. 257/737 |
| 2013/0099383 A1 * | 4/2013 | Meyer-Berg et al. ......... 257/772 |

* cited by examiner

*Primary Examiner* — Phuc Dang
(74) *Attorney, Agent, or Firm* — Wolf, Greenfield & Sacks, P.C.

(57) ABSTRACT

Integrated circuits having electrically conductive traces are described. The electrically conductive traces may be formed of multiple electrically conductive layers. One or more of the multiple electrically conductive layers may have a cut formed therein to form a gap in that electrically conductive layer. One or more electrical conductive layers of the electrical conductive traces may bridge the gap.

20 Claims, 2 Drawing Sheets

INTEGRATED CIRCUIT WIRING FABRICATION AND RELATED METHODS AND APPARATUS

CROSS-REFERENCE TO RELATED APPLICATIONS

This Application claims the benefit under 35 U.S.C. §119 (e) of U.S. Provisional Application Ser. No. 61/618,931, entitled "INTEGRATED CIRCUIT WIRING FABRICATION AND RELATED METHODS AND APPARATUS" filed on Apr. 2, 2012 under Attorney Docket No. G0766.70039US00, which is hereby incorporated herein by reference in its entirety.

BACKGROUND

1. Field

The present application relates to integrated circuit (IC) wiring fabrication and related methods and apparatus.

2. Related Art

Some integrated circuits include metallic traces for conducting electrical signals, which are sometimes referred to as wiring lines. Integrated circuits sometimes also include inter-connects which can be connected to the metallic traces.

SUMMARY

According to an aspect of the present application, a device is provided, comprising an electrical routing line comprising more than one metal layer, and an inter-connect placed on the routing line. A gap exists in one or more layers of the routing line.

According to an aspect of the present application, a method of fabricating a circuit is provided, comprising forming an electrical routing line comprising more than one metal layer, and forming an inter-connect on the routing line, wherein a gap exists in one or more layers of the routing line.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
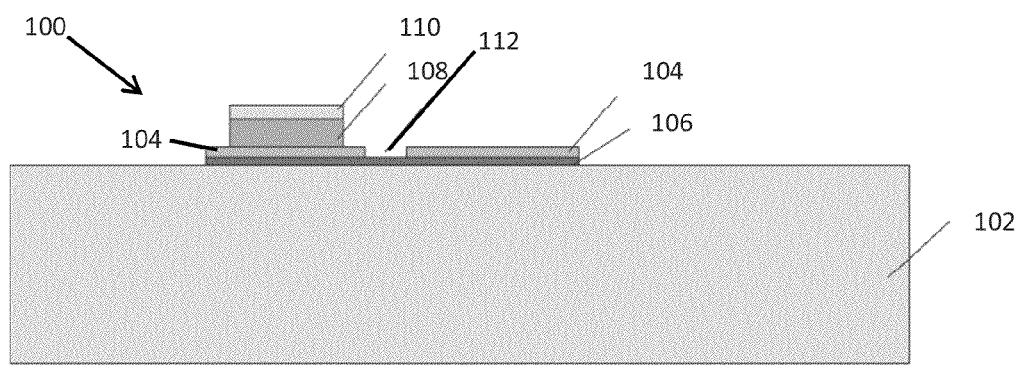
FIG. 1 illustrates a cross-sectional view of a device including an electrical routing line, according to a non-limiting embodiment.

Applicants have appreciated that conventional IC electrical routing lines are sometimes damaged or negatively impacted when solder is applied to the routing lines. The routing line material can dissolve into the solder which can result in poor electrical conductivity for the routing lines.

As a non-limiting example, it may be desirable in some embodiments to bond two wafers together (e.g., an integrated circuit (IC) wafer and a wafer including microelectromechanical systems (MEMS) components, such as a MEMS resonator). Eutectic gold-tin (AuSn) may be used for electrical connections between the bonded wafers in wafer-level packaging. The gold-tin inter-connects may form individual bumps or seal-rings for hermitic encapsulation of individual die.

During bonding of the wafers (as a non-limiting example), solder may reflow. When solder reflows while in contact with a gold layer during bonding, gold dissolves in the solder and gold-tin alloy AuSn4 is formed. In applications where thick layers of gold are required and where the inner-connecting bumps and seal-rings are placed in contact with the gold electrical lines, the gold on the routing lines may be substantially dissolved into solder during eutectic bonding. Gold-tin alloy on the routing lines can form undesirable segregation of micro-droplets and discontinuous metallization coverage. This causes poor or no electrical continuity between the bonded wafers or inter-connects.

According to an aspect of the application, apparatus for wiring of integrated circuits, printed circuit boards, and other electronic circuits are described. In a non-limiting embodiment, electrical routing lines may be formed of more than one layer of metal (or more than one conductive layer more generally). The top metal (or conductive layer) may be gold, though other materials may also be used and may be dissolved in solder. The underlying metals (or conductive layers) may be used as an adhesion or barrier layer and they may include a non-wetting material with respect to solder. In a non-limiting embodiment, inter-connect bumps are placed on the top metallic layer. The inter-connect bumps may be formed of gold and solder. In a non-limiting embodiment, a cut through the top metallic layer of the electrical routing line is used to separate the inter-connects from the rest of the routing lines. Solder and gold alloy formed at the inter-connects during bonding of wafers may be constrained by the cut so as not to affect the top metal of the routing lines. The electric current may flow through the underlying adhesion or barrier metallic layers, which bridges the cut in the top metal.

Thus, one or more aspects described herein may function to restrain the solder reflow and prevent the gold dissolution in the gold routing areas to achieve good electrical paths.

The aspects described above, as well as additional aspects, are described further below. These aspects may be used individually, all together, or in any combination of two or more, as the technology is not limited in this respect.

FIG. 1 illustrates a cross-sectional view of a non-limiting example of a device according to an aspect of the present application. As shown, the device 100 may include a substrate 102 on which an electrical routing line is formed, represented by the combination of 104 and 106. Thus, as shown, the routing line may include more than one metal layer. The top metal layer 104 may be gold, though other materials may also be used, and such materials may, in at least some embodiments, be of a type which dissolves in solder. The top metal layer 104 may include metals that can form a eutectic bond. The underlying metal layer(s) 106 (of which more than one layer may be included) may be used as the adhesion or barrier layers, and they may include non-wetting materials with respect to solder. These layers may not form eutectic bond, but are good barrier layers against diffusion of the top metal layer 104 into the substrate 102 and/or good adhesion layers to the substrate 102. Non-limiting examples of barrier or adhesion layers which may be used as the metal layer 106 include Ti, TiW, TiWN, Cr, Mo and Al. Other materials may also be used.

In FIG. 1, the inter-connects (formed by the combination of 108 and 110) are electroplated on top of the top metal layer 104. In one embodiment, the inter-connects may be formed of a layer 108 formed of the same material as the top metal layer 104, though not all embodiments are limited in this respect.

For example, the layer 108 may be gold and the top metal layer 104 may be gold. The layer 110 of the inter-connect may be solder. Thus, the inter-connects in some embodiments may be gold-solder inter-connects.

As shown, a gap (or cut) 112 is formed in the top metal layer 104 in the vicinity of the inter-connecting bump. The cut 112 may be formed in any suitable manner (e.g., etching, selective deposition, or any other technique). Thus, when the solder reflows in the inter-connect bump (e.g., during bonding of the illustrated device to another wafer, or for any other reason), the gold-tin alloy (assuming the top metal layer 104 is gold and the layer 110 is solder including tin in this non-limiting example) may be constrained by the cut 112 in the top metal layer 104 from wetting or dissolving the portion of the top metal layer 104 on the routing lines. The resulting electrical connection may, in at least some embodiments, therefore be improved compared to the case where the solder reflows onto the top metal layer 104 of the routing line. The electric current flows through the layer 106 (e.g., the underlying adhesion or barrier metals) which bridges the cut 112 in the top metal layer 104.

The illustrated components of FIG. 1 may have any suitable dimensions. In some embodiments, the gap (or cut) 112 in the top metal layer 104 may be made to be small, but sufficiently large to prevent solder reflow onto the routing lines. The gap 112 in the top metal layer 104 may be traversed by the electric current passing through the layer 106 over that distance. In some embodiments, the layer 106 may be formed of a material which is less conductive than the top metal layer 104, and therefore it may be preferable to make the gap 112 in the top metal layer 104 small so that the electric current does not traverse the higher resistance layer 106 over a long distance. However, as previously mentioned, the gap should be sufficiently large to prevent the solder reflow onto the routing line.

Figure 2:
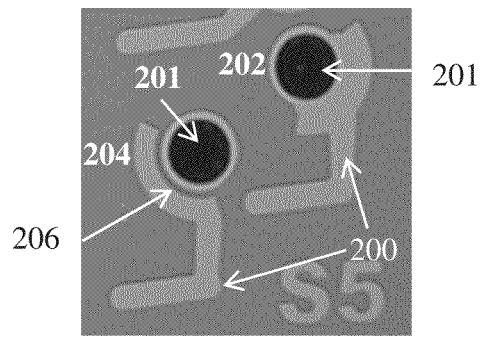
FIG. 2 illustrates a top view of two electrical routing lines connected to respective inter-connects.

FIG. 2 shows a routing line made of a gold top layer 200 and two Au/Sn plated inner-connects 201 placed on the gold top layer 200 before eutectic bonding. In structure 202, the gold layer 200 is continuous, while in structure 204 there is a gap (or cut) 206 in the gold layer 200 in the vicinity of the inter-connect 201. The gap 206 may prevent solder from migrating or reflowing onto the gold routing areas.

Figure 3:
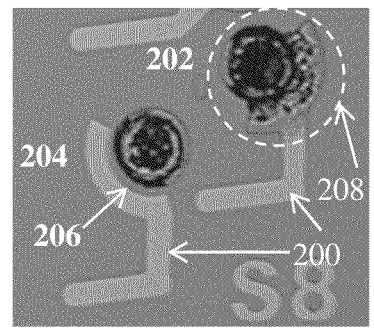
FIG. 3 illustrates the structure of FIG. 2 after solder reflow occurs.

FIG. 3 shows the same structure of FIG. 2 after eutectic bonding. In structure 202, the solder has reflowed to the routing areas and has dissolved the gold there, as shown by region 208, causing poor electrical contact. The cut 206 in the gold layer 200 in structure 204 has restrained the solder reflow and prevented it from spreading to the surrounding routing area.

Any suitable materials may be used for the components described herein. While various non-limiting examples have been described as applying to Au/Sn bonding of wafers, with gold routing lines, it should be appreciated that other materials may be used. One or more aspects of the present application may be used with any suitable routing layer material. The various aspects may provide greater benefit in situations in which the routing layer is made of a material that would be dissolved into solder, though not all embodiments are limited in this respect.

It should be understood that the various embodiments shown in the figures are illustrative representations, and are not necessarily drawn to scale. Reference throughout the specification to "one embodiment" or "an embodiment" or "some embodiments" means that a particular feature, structure, material, or characteristic described in connection with the embodiment(s) is included in at least one embodiment, but not necessarily in all embodiments. Consequently, appearances of the phrases "in one embodiment," "in an embodiment," or "in some embodiments" in various places throughout the Specification are not necessarily referring to the same embodiment.

Unless the context clearly requires otherwise, throughout the disclosure, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list; all of the items in the list; and any combination of the items in the list.

Having thus described several embodiments of this disclosure, it is to be appreciated that various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

The invention claimed is:

1. A device, comprising:
   an electrical routing line comprising more than one metal layer; and
   an inter-connect placed on the routing line,
   wherein a gap exists in one or more layers of the more than one metal layer of the routing line.

2. The device of claim 1, wherein the device further comprises solder disposed on the inter-connect.

3. The device of claim 2, wherein the gap is configured to constrain reflow of the solder.

4. The device of claim 1, wherein at least one layer of the more than one metal layer of the routing line includes gold.

5. The device of claim 1, wherein:
   the more than one metal layer comprises one or more first layers and one or more second layers,
   the gap that exists in the one or more layers exists in the one or more first layers and does not exist in the one or more second layers; and
   the one or more second layers are arranged to conduct electric current across the gap that exists in the one or more first layers of the routing line.

6. The device of claim 5, wherein at least one of the one or more second layers arranged to conduct electric current across the gap comprises a material selected from the group consisting of: Ti, TiW, TiWN, Cr, Mo and Al.

7. The device of claim 5, wherein:
   the gap has a first width;
   the routing line has a second width; and
   the first width is narrower than the second width.

8. The device of claim 7, wherein the gap adjoins an exterior edge of the inter-connect.

9. The device of claim 1, wherein the gap exists in more than one layer of the more than one metal layer of the routing line.

10. The device of claim 1, wherein the gap exists in a top layer of the more than one metal layer of the routing layer and in one or more layers of the more than one metal layer other than the top layer of the routing line.

11. A method of fabricating a circuit, comprising:
   forming an electrical routing line comprising more than one metal layer; and
   forming an inter-connect on the routing line,
   wherein a gap exists in one or more layers of the more than one metal layer of the routing line.

12. The method of claim 11, further comprising forming solder on the inter-connect.

13. The method of claim 12, further comprising forming the gap to constrain reflow of the solder.

14. The method of claim 11, wherein at least one layer of the more than one metal layer of the routing line includes gold.

15. The method of claim 11, further comprising bonding a first wafer to a second wafer, wherein the routing line is on the first wafer.

16. The method of claim 11, wherein forming the routing line comprising more than one metal layer comprises forming one or more barrier or adhesion layers, the one or more barrier or adhesion layers being metal layers.

17. The method of claim 11, further comprising forming the gap in more than one layer of the more than one metal layer of the routing line.

18. The method of claim 11, further comprising forming the gap in a top layer of the more than one metal layer of the routing line and in one or more layers of the more than one metal layer other than the top layer of the routing line.

19. A method of fabricating a circuit, comprising:
   forming an electrical routing line comprising more than one metal layer; and
   forming an inter-connect on the routing line,
   wherein a gap exists in one or more layers of the routing line, and
   wherein the method further comprises forming one or more barrier layers in the gap.

20. The method of claim 19, wherein at least one of the one or more barrier layers comprises a material selected from the group consisting of: Ti, TiW, TiWN, Cr, Mo and Al.

* * * * *